(12) United States Patent
Sugamori

(10) Patent No.: US 6,445,208 B1
(45) Date of Patent: Sep. 3, 2002

(54) POWER SOURCE CURRENT MEASUREMENT UNIT FOR SEMICONDUCTOR TEST SYSTEM

(75) Inventor: Shigeru Sugamori, Santa Clara, CA (US)

(73) Assignee: Advantest Corp., Tokyo (JP)

(*) Notice: Subject to any disclaimer, the term of this patent is extended or adjusted under 35 U.S.C. 154(b) by 0 days.

(21) Appl. No.: 09/544,058

(22) Filed: Apr. 6, 2000

(51) Int. Cl.[7] .............................. G01R 31/36
(52) U.S. Cl. ...................... 324/771; 324/765
(58) Field of Search .............. 324/765, 158.1, 324/771, 73.1; 365/189.07, 201; 702/79, 85, 119; 714/39, 718, 724, 741, 742

(56) References Cited

U.S. PATENT DOCUMENTS

| | | |
|---|---|---|
| 5,760,599 A | 6/1998 | Ehiro |
| 5,917,331 A | 6/1999 | Person |
| 5,930,735 A * | 7/1999 | Pun .......................... 702/119 |
| 5,951,705 A * | 9/1999 | Arkin et al. ................ 714/738 |
| 5,999,008 A | 12/1999 | Currin et al. |
| 6,087,843 A * | 7/2000 | Pun et al. .................... 324/765 |
| 6,202,186 B1 * | 3/2001 | Oonk .......................... 714/738 |
| 6,226,765 B1 * | 5/2001 | Le et al. ...................... 714/718 |

* cited by examiner

*Primary Examiner*—Michael J. Sherry
*Assistant Examiner*—Minh N. Tang
(74) *Attorney, Agent, or Firm*—Muramatsu & Associates

(57) ABSTRACT

A semiconductor test system having a power source current measurement unit for measuring a power source current of a device under test with high speed and accuracy. The power source measurement unit includes a DA converter for generating a source voltage, an operational amplifier for forming a negative feedback loop and supplying the source voltage to a power pin of the device under test thereby supplying a power source current to the power pin, a voltage amplifier for amplifying a voltage representing the amount of power source current supplied to the device under test, an integration circuit for integrating an output signal of the voltage amplifier for a predetermined integration time, and an AD converter for converting an output signal of the integration circuit to a digital signal after the integration time.

5 Claims, 8 Drawing Sheets

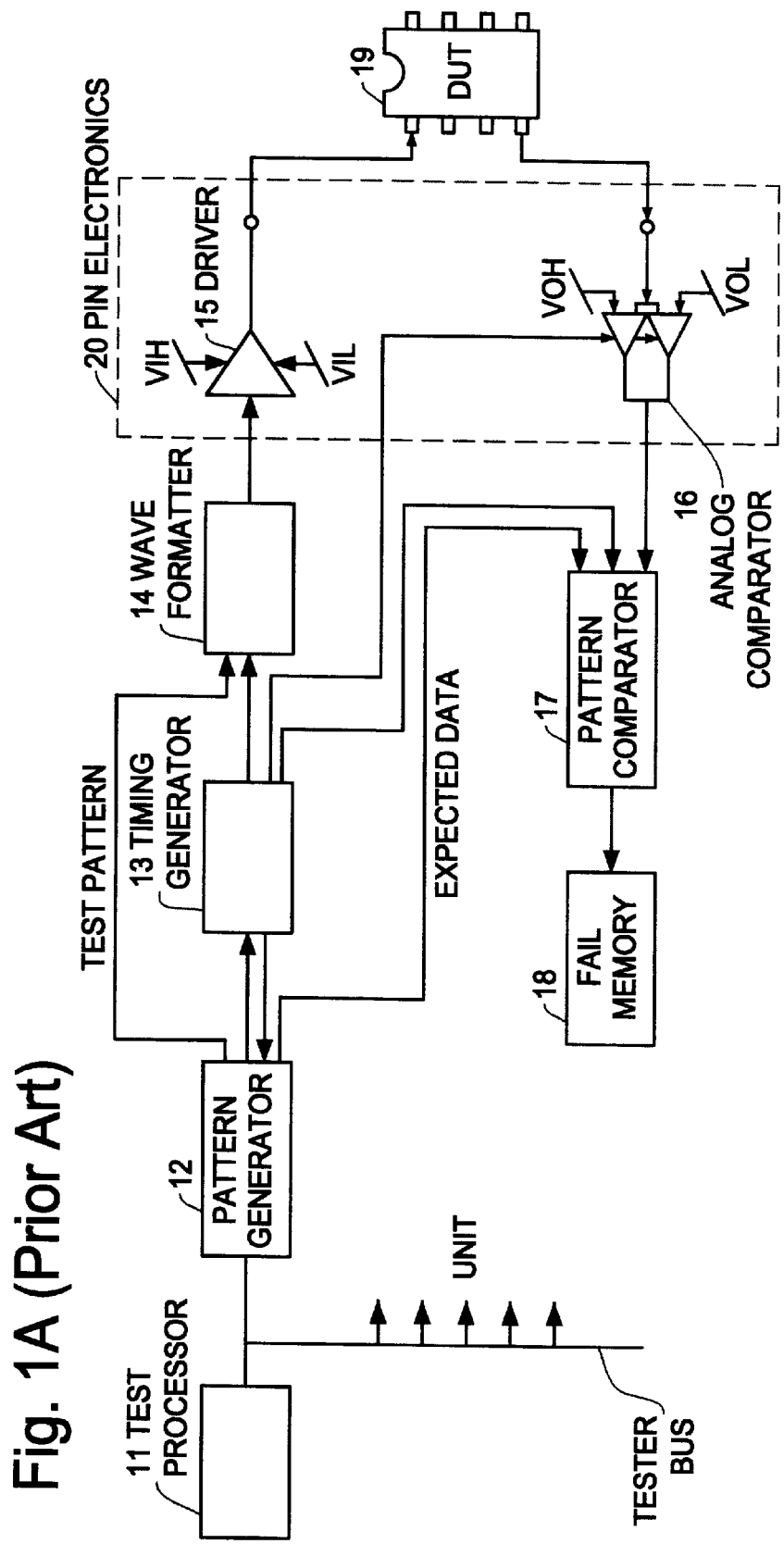

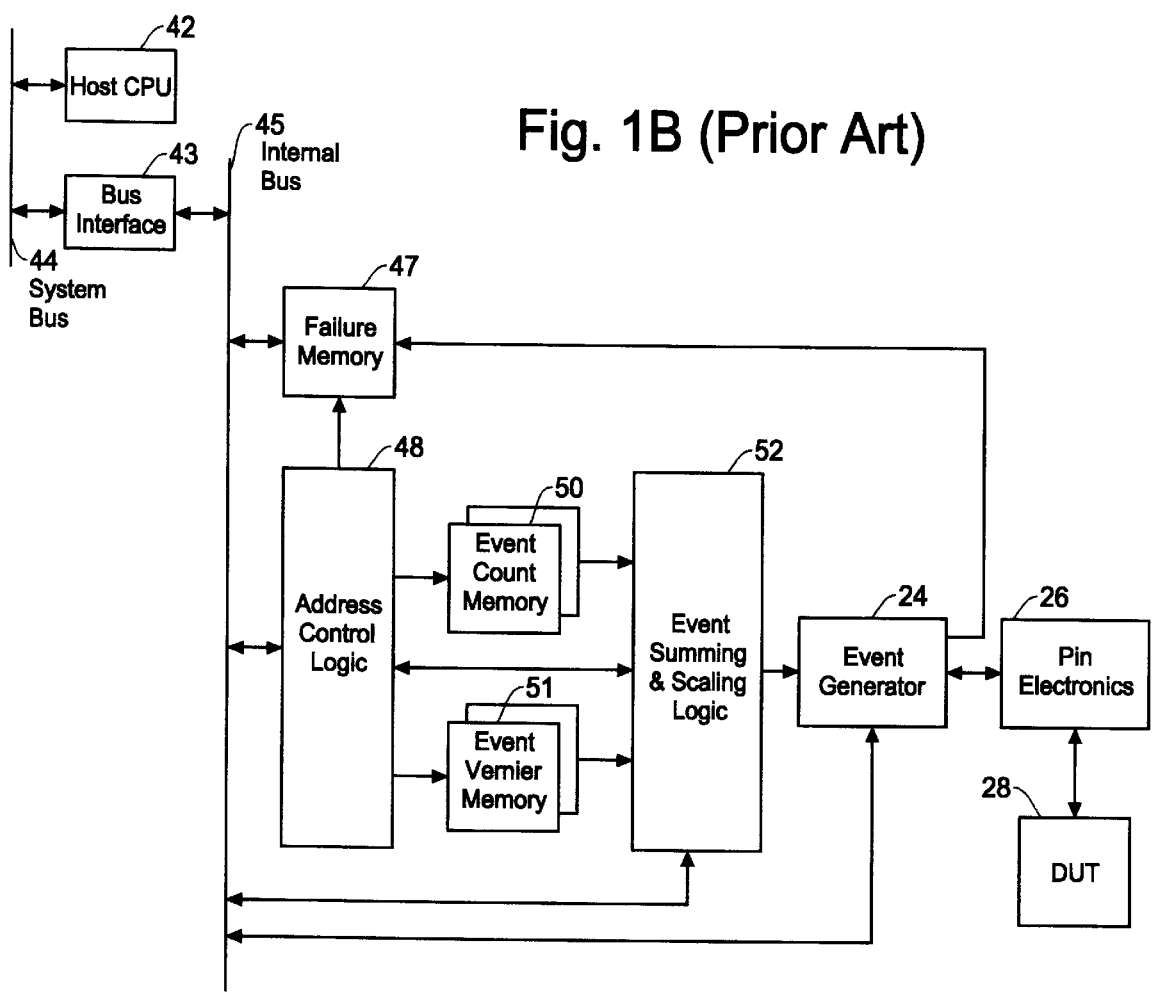

DUT Clock

IDD

IM output

IM Sampling

DUT Clock

IDD

IM Integration

POWER SOURCE CURRENT MEASUREMENT UNIT FOR SEMICONDUCTOR TEST SYSTEM

FIELD OF THE INVENTION

This invention relates to a semiconductor test system for testing semiconductor integrated circuits such as a large scale integrated (LSI) circuit, and more particularly, to a power source current measurement unit provided in a semiconductor test system which is capable of measuring a power source current of a device under test with high speed and high accuracy. The power source current measurement unit of the present invention is advantageously applicable to measurement of a power source current $I_{DD}$ of a CMOS integrated circuit.

BACKGROUND OF THE INVENTION

The power source (supply) current measurement unit of the present invention is used in a semiconductor test system for testing semiconductor integrated circuits such as LSIs (hereafter may also be referred to as "device under test"). Such a semiconductor test system performs mainly a functional test of the device under test, it also has a functionality for performing a DC parametric test in which DC voltage and DC current of the device under test are evaluated. The present invention is directed to a power source current measurement unit (DC test unit) for measuring a power source current of a device under test as a part of the DC parametric test.

The inventor of this invention has proposed a semiconductor test system based on notions of event (event based test system) which has an architecture different from a cyclized semiconductor test system (cycle based test system) widely used today. The power source current measurement unit of the present invention can be advantageously applied to the event based test system, however, it can also provide significant effects when used in the cycle based test system. Therefore, brief explanation will be made in the following as to the cycle based test system and event based test system.

FIG. 1A is a block diagram showing an example of basic configuration in the cycle based test system. In this example, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and the test pattern is supplied to a device under test (DUT) 19 through a driver 15.

The DUT 19 generates an output signal in response to the test pattern which is provided to an analog comparator 16 in a pin electronics 20. The output signal is converted to a logic signal by the analog comparator 16 with reference to a predetermined threshold voltage level. The logic signal is compared with expected value data from the pattern generator 12 by a logic comparator 17. The result of the logic comparison is stored in a failure memory 18 corresponding to the address of the DUT 19.

In such a cycle based test system, pattern data for producing test pattern must be described separately by waveform data, vector data, and timing data for each test cycle. Therefore, hardware and software involved in the cycle based test system become complicated, which makes it difficult to constitute a test system in such a way that each test pin is independent from the others.

FIG. 1B is a schematic block diagram showing an example of basic structure in an event based test system. Description for further details of the event based test system is given in the U.S. patent application Ser. No. 09/406,300 and U.S. patent application Ser. No. 09/259,401 filed by the same inventor of this invention.

In this example, the event based test system includes a host computer 42, a bus interface 43, an internal bus 45, an address control logic 48, a failure memory 47, an event memory consists of an event count memory 50 and an event vernier memory 51, an event summing and scaling logic 52, an event generator 24, and a pin electronics 26. A semiconductor device under test (DUT) 28 is connected to the pin electronics 26.

An example of the host computer 42 is a work station having a UNIX operating system therein. The host computer 42 functions as a user interface to enable a user to instruct the start and stop operation of the test, to load a test program and other test conditions, or to perform test result analysis in the host computer. The host computer 42 interfaces with a hardware test system through the system bus 44 and the bus interface 43.

The internal bus 45 is a bus in the hardware test system. An example of address control logic 48 is a tester processor which is exclusive to the hardware test system and is not accessible by a user. The address control logic 48 provides instructions to other functional blocks in the test system based on the test program and conditions from the host computer 42. The failure memory 47 stores test results, such as failure information of the DUT 28, in the addresses defined by the address control logic 48. The information stored in the failure memory 47 is used in the failure analysis stage of the device under test.

The address control logic 48 provides address data to the event memory configured by the event count memory 50 and the event vernier memory 51. The event memory stores event timing data describing each event (change point from "1" to "0" or from "0" to "1") and its timing. For example, the event memory stores the timing data by two different types of data, one is integral part data showing an integer multiple of the reference clock, and fractional part data showing a fraction of the reference clock.

The event summing and scaling logic 52 is to produce data showing overall timing (delay time) of each event with respect to a predetermined reference point by summing the event timing data or modifying the timing data of each event by a scaling factor. The event generator 24 is to actually generate the test pattern (drive event) based on the overall timing data which is provided to the DUT 28 through the pin electronics 26. By comparing the response output signal of the DUT 28 with the expected data pattern (sampling event), the particular output pin of the DUT 28 is evaluated by the test system.

In the event based test system, since the event data for producing the test pattern is described only by the timing data of events, the data structure of the event data is significantly simplified. Therefore, the event based test system can be configured by a plurality of test pins each being independent from the others.

In the test system described above, the structure of the pin electronics for applying the test pattern to the device under test and receiving the output signal of the device under test is basically the same in either the cycle based test system or the event based test system. Generally, the pin electronics is also provided with a measurement unit for performing a DC parametric test. In FIG. 2, the pin electronics 26 which deals with the drive event (test pattern), sampling event (strobe) and parameters for the test unit is shown in more detail along with the event generator 24, pattern comparator 38 and the device under test (DUT 28).

The event generator 24 produces drive events (test pattern) which are provided to an input pin of the DUT 28 through the driver 35 in the pin electronics 26 with a predetermined amplitude and a slew rate. The event generator 24 further produces a sampling event which is provided to the analog comparator 36 as a strobe signal for sampling an output signal of the DUT 28. The output signal of the DUT 28 is converted to a logic signal by the analog comparator 36 when compared with predetermined reference voltages at the timing of the strobe signal. The logic signal at the output of the analog comparator 36 is compared with an expected logic pattern by the pattern comparator 38.

A DC test unit 37 performs DC parametric test for the device under test under the control of a controller such as the host computer. In the DC parametric test, ordinarily, the drive events supplied by the driver 35 to the device under test include a clock signal. The DC test unit 37 supplies a power source to a predetermined power pin of the device under test and measures a power source current, for example, $I_{DD}$ flowing through the power pin of the device under test. The measured value is transmitted to the host computer.

FIG. 3 shows an example of structure in a conventional DC test unit. This example only shows a power source current measurement unit for measuring a power supply (source) current of the device under test, for example, $I_{DD}$ of a CMOS device. The power source current measurement unit is formed with a DA (digital-to-analog) converter 71, an operational amplifier 72, a current buffer 73, a current measurement resistor 74, a differential amplifier 75, an averaging circuit 76, an AD (analog-to-digital) converter 77 and a buffer memory 78.

When the amount of voltage to be supplied, as a power source, to the device under test is specified by a controller such as the host computer, the DA converter 71 produces the specified voltage which is supplied to the device under test 28 through the operational amplifier 72. The operational amplifier 72 provides the power source to the device under test 28 through the current buffer 73 and the current measurement resistor 74.

As shown in FIG. 3, the power pin of the device under test 28 is a feedback point of a negative feedback loop formed in the measurement unit. Consequently, the input voltage at the operational amplifier 72 shows the voltage of the power source supplied to the device under test 28. The power source current is supplied by the operational amplifier 72 through the current measurement resistor 74 to the device under test 28. In this arrangement, the power source current flowing in the device under test 28 is measured by the voltage across the current measurement resistor 74 which is detected by the differential amplifier 75.

The output of the differential amplifier 75 is averaged by the averaging circuit 76 and supplied to the AD converter 77. The AD converter 77 samples an incoming signal by a sampling signal of predetermined repetition rate and converts the sampled voltage to a digital signal. The digital signal is stored in the buffer memory 78.

FIGS. 4A–4D are timing charts showing an operation of the conventional power source current measurement unit of FIG. 3. The test system supplies a clock signal of FIG. 4A to the device under test 28 through the driver 35 (FIG. 2), thereby starting the operation of the device under test 28. Although not shown, the test system also provides test patterns to the signal pins of the device under test 28. The power source current to the device under test such as a CMOS device changes in an impulse manner in the same repetition rate as the clock signal as shown in FIG. 4B.

The power source current is detected by the circuit configuration of FIG. 3 as a waveform of FIG. 4C which is provided to the AD converter 77. The AD converter 77 samples the measured current waveform of FIG. 4C by a predetermined sampling interval t and converts the sampled analog voltages to digital signals. The sampling interval t is, for example, several ten microseconds.

Since the power source current of the CMOS device largely changes depending upon the inner circuit conditions, the measured current waveforms provided to the AD converter 77 show a complicated pattern. Thus, in the conventional technology, to measure the current value accurately, the sampling operation shown in FIG. 4D is repeated to increase the number of samples, thereby improving the measurement accuracy by averaging the samples.

As has been foregoing, in the power supply current $I_{DD}$ measurement conducted by the conventional circuit, for improving the measurement accuracy, the same test pattern must be repeated many times to increase the number of samples, resulting in increase in the measurement time. If the measurement time is shortened, the measurement accuracy is significantly decreased especially when the current waveform changes rapidly. The conventional measurement circuit also involves a problem that it is not possible to specify as to which clock signal has caused the defect in the measured source current $I_{DD}$.

SUMMARY OF THE INVENTION

Therefore, it is an object of the present invention to provide a power source current measurement unit for a semiconductor test system which is capable of measuring a power source current of a device under test with high speed and high accuracy.

It is another object of the present invention to provide a power source current measurement unit for measuring a power source current $I_{DD}$ of a device under test when the device under test is a CMOS device.

It is a further object of the present invention to provide a power source current measurement unit which is capable of measuring a power source current of a device under test within a short period of time with high accuracy by integrating measured values of power source current by an integration circuit and averaging the integrated value by the measured time.

It is a further object of the present invention to provide a power source current measurement unit which is capable of directly measuring an average value of power source current of a device under test by adjusting a repetition rate of a clock signal supplied from the semiconductor test system to the device under test by an arbitrary scaling factor and detecting the power source current in synchronism with the adjusted clock signal.

It is a further object of the present invention to provide a power source current measurement unit which is capable of detecting the relationship between the defective power source current value and a specific clock signal applied to the device under test by adjusting a repetition rate of a clock signal supplied from the semiconductor test system to the device under test by an arbitrary scaling factor and detecting the power source current in synchronism with the adjusted clock signal.

The power source current measurement unit of the present invention is provided in a semiconductor test system and is comprised of a DA (digital-to-analog) converter for generating a source voltage to be supplied to a device under test based on a digital signal received, an operational amplifier for forming a negative feedback loop and supplying the source voltage from the DA converter to a power pin of the device under test thereby supplying a power source current to the power pin through a current measurement resistor whose resistance is known, a voltage amplifier for amplifying a voltage representing the amount of power source current supplied to the device under test, an integration circuit for integrating an output signal of the voltage amplifier for a predetermined integration time, and an AD (analog-to-digital) converter for converting an output signal of the integration circuit after the integration time.

A clock signal for the device under test is supplied by the semiconductor test system for activating an operation of the device under test and an average value of the power source current resulted from the clock signal is measured by the power source current measurement. The integration circuit in the power source current measurement unit of the present invention includes a switch where the integration is performed by opening the switch for a predetermined time length.

Another aspect of the present invention is a semiconductor test system for evaluating a semiconductor device under test. The semiconductor test system of the present invention is comprised of test signal generating means for generating a test signal to the device under test based on event data prepared in advance, a pin electronics provided between the test signal generating means and the device under test and having a driver which provides the test signal to the device under test with predetermined amplitude and a comparator which compares a response output of the device under test with a predetermined reference voltage, and a power source current measurement unit provided either inside or outside of the pin electronics for measuring a power source current of the device under test.

The power source current measurement unit includes a DA converter for generating a source voltage to be supplied to a device under test based on a digital signal received, an operational amplifier for forming a negative feedback loop and supplying the source voltage from the DA converter to a power pin of the device under test thereby supplying a power source current to the power pin through a current measurement resistor whose resistance is known, a voltage amplifier for amplifying a voltage representing the power source current supplied to the device under test, an integration circuit for integrating an output signal of the voltage amplifier for a predetermined integration time, and an AD converter for converting an output signal of the integration circuit after the integration time.

The semiconductor test system supplies a clock signal to the device under test for activating an operation of the device under test. The semiconductor test system of the present invention further includes a scaling function which can modify timing data in the event data by an arbitrary factor. By adjusting the repetition rate of the clock signal from the semiconductor test system to the device under test by the scaling function, the clock signal can be set to a repetition rate equivalent to an operating speed of the power source current measurement unit. Accordingly, it is possible to synchronize the clock signal period with the open/close operation of the switch in the integration circuit in the power source current measurement unit, thereby enabling to measure the power source current corresponding to a particular period of the clock signal.

As a consequence, the power source current measurement unit of the present invention is capable of measuring the power source current of the device under test at high speed with high accuracy. Thus, the power source current measurement unit is advantageously applied to measuring a power source current $I_{DD}$ of a CMOS device. The power source current measurement unit of the present invention is capable of measuring the power source current of a device under test within a short period of time with high accuracy by integrating measured waveforms of power source current by an integration circuit and averaging the integrated value by the measured time.

The power source current measurement unit of the present invention is advantageously employed in an event based test system. The power source current measurement unit is capable of directly measuring an average value of power source current of the device under test by adjusting the repetition rate of the clock signal supplied from event based test system to the device under test by an arbitrary factor and detecting the power source current in synchronism with the adjusted clock signal. Further, since the power source current of the device under test can be measured in synchronism with the clock signal, it is possible to detect the relationship between the defective power source current value and a specific clock signal which caused the defect.

BRIEF DESCRIPTION OF THE DRAWINGS

FIG. 1A is a block diagram showing a basic configuration of a cycle based semiconductor test system in the conventional technology, and FIG. 1B is a block diagram showing a basic configuration of an event based test system which is a new type of semiconductor test system.

DETAILED DESCRIPTION OF THE PREFERRED EMBODIMENT

Figure 5:
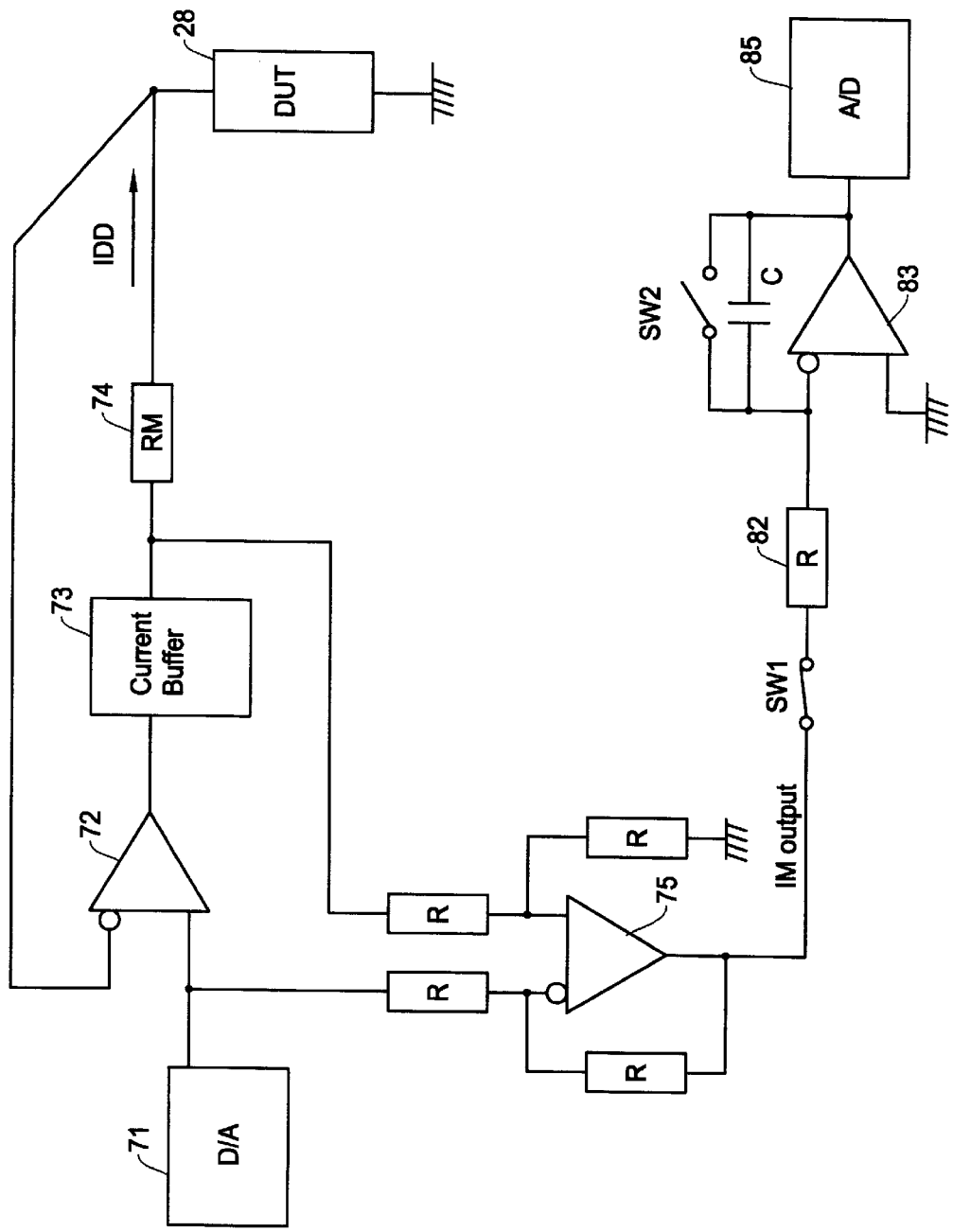
FIG. 5 is a circuit diagram showing an example of configuration in a power source current measurement unit for measuring power source current of the device under test in accordance with the present invention.

The embodiment of the present invention is explained with reference to FIGS. 5 and 6. FIG. 5 is a block diagram showing a basic structure of the power source (supply) current measurement unit of the present invention. The timing charts of FIGS. 6A–6C show waveforms involved in the operation of the power source current measurement unit of FIG. 5. The power source current measurement unit of the present invention integrates the power source current of the device under test by an integration circuit and obtains an average value of the integrated current, thereby measuring the power source current with high speed and accuracy.

In FIG. 5, the power source current measurement unit includes a DA (digital-to-analog) converter 71, an operational amplifier 72, a current buffer 73, a current measurement resistor 74, a differential amplifier 75, an integration circuit 83, switches SW1 and SW2, and an AD (analog-to-digital) converter 85. The integration circuit 83 has an integration constant which is defined by an integration resistor 82 and an integration capacitor C.

When the amount of voltage to be supplied as a power source to the device under test is specified by a controller such as the host computer, the DA converter 71 produces the specified voltage which is supplied to the device under test 28 through the operational amplifier 72. The operational amplifier 72 provides the power source to the device under test 28 through the current buffer 73 and the current measurement resistor 74.

As shown in FIG. 5, the power pin of the device under test 28 is a feedback point of a negative feedback loop formed in the measurement unit. Consequently, the input voltage at the operational amplifier 72 shows the voltage of the power source to the device under test 28. The power source current is supplied by the operational amplifier 72 through the current measurement resistor 74 to the device under test 28. Thus, the power source current flowing through the device under test 28 is represented by the voltage across the current measurement resistor 74 which is detected by the differential amplifier 75.

The output of the differential amplifier 75 is provided to the integration circuit 83 through the switch SW1. The integration circuit 83 integrates the input signal when the switch SW2 is off (open). Thus, the output voltage of the differential amplifier 75 which represents the power source current of the device under test is integrated by the integration circuit 83. When the integration operation is stopped by opening the switch SW1 at the end of measurement time (integration), the output voltage of the integration circuit 83 is converted to the digital signal by the AD converter 85. Thus, the average value of the power source current of the device under test is obtained by dividing the digital value by the measurement time.

Figure 2:
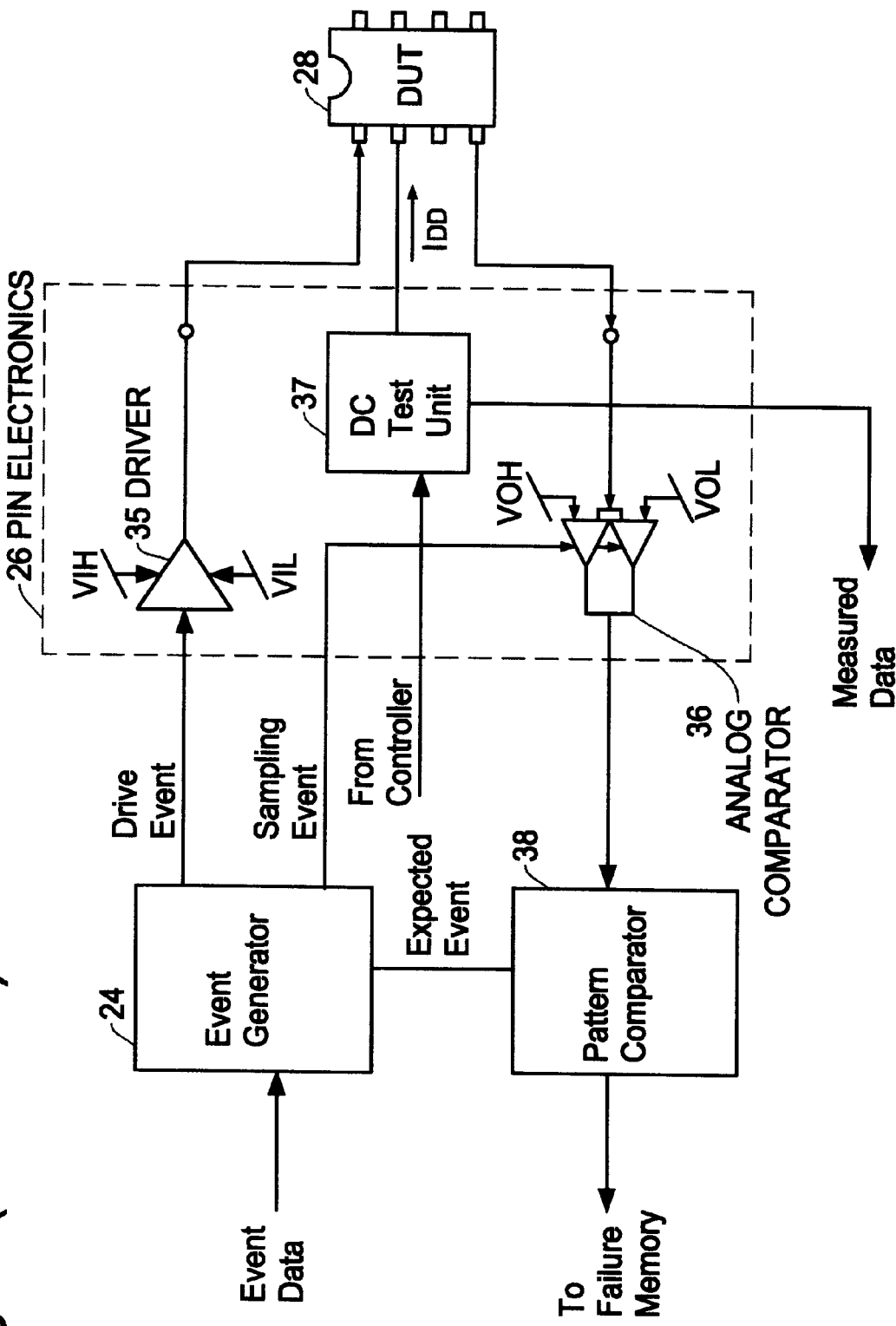
FIG. 2 is a block diagram showing an example of structure in a pin electronics that can be used either in an event based test system or cycle based test system.
Figure 3:
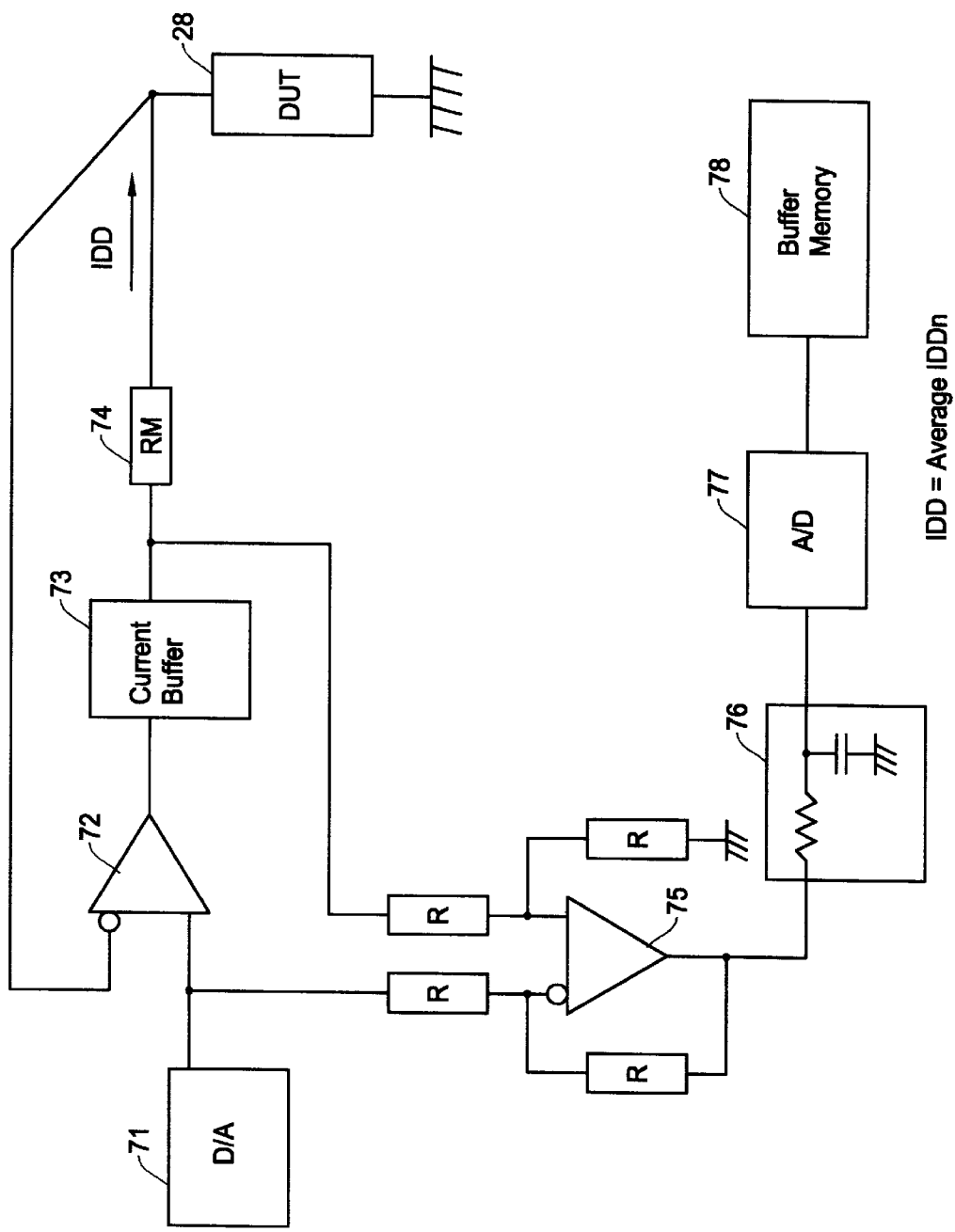
FIG. 3 is a circuit diagram showing an example of configuration in a power source current measurement unit for measuring power source current of the device under test in the conventional technology.
Figure 4A:
FIGS. 4A–4D are timing charts showing an operation in the power source current measurement unit in the conventional technology of FIG. 3.
Figure 4B:
Figure 4C:
Figure 4D:
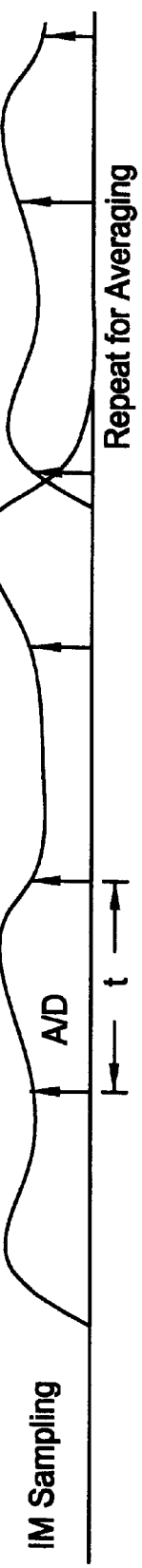
Figure 6A:
FIGS. 6A–6C are timing charts showing an operation in the power source current measurement unit in the present invention of FIG. 5.
Figure 6B:
Figure 6C:

FIGS. 6A–6C are timing charts showing an operation of the power source current measurement unit of the present invention shown in FIG. 5. The test system supplies a clock signal of FIG. 6A to the device under test 28 through the driver 35 (FIG. 2), thereby starting the operation of the device under test 28. Although not shown, the test system also provides test patterns to the signal pins of the device under test 28.

In the circuit configuration of FIG. 5, the power source current is detected as a voltage drop across the current measurement resistor 74 which is a waveform shown in FIG. 6B. The measured current waveform of FIG. 6B is provided to the integration circuit 83 through the switch SW1. The switch SW2 of the integration circuit 83 is opened at the start timing of the clock signal, thereby initiating the integration operation. As shown in FIG. 6C, the measured current waveform having an impulse shape (FIG. 6B) is continuously accumulated by the integration circuit 83.

Then, the switch SW1 is opened (off) after a predetermined number of clock pulses, and the output voltage of the integration circuit is converted to a digital signal by the AD converter 85. Thus, the average power source current to the device under test is obtained by dividing the measured value in the digital signal by the time length during which the clock signal is applied to the device under test, i.e., the integration time. In this method, measured current waveform is consecutively integrated during a predetermined time and the integrated voltage value after the predetermined time is converted to the digital signal by the AD converter. Accordingly, the timing of sampling in the AD converter does not affect the measurement of the current waveforms. Therefore, in the present invention, it is unnecessary to repeat a large number of sampling operations in the AD converter as required in the conventional technology, resulting in the current measurement of high speed and high accuracy.

Generally, an overall operation speed of the power source current measurement unit such as shown in FIG. 5 is relatively slow, for example, requiring a clock repetition rate of several ten microseconds or more. This is because the circuit arrangement in the current measurement unit includes the operational amplifier and integration circuit forming the negative feedback loop which are relatively slow in operation. A clock speed of a device under test, such as a CMOS device, is considerably higher in operation than the operation speed of the power source current measurement unit. Therefore, as described in the foregoing, the power source current is measured relative to the time length of a large number of clock signals by obtaining the average value of the current during the time length.

In another aspect of the present invention, the repetition rate of the clock signal supplied to the device under test is reduced to be equivalent to the operation speed of the power source current measurement unit. In the conventional semiconductor test system, it is not possible to adjust the repetition rate of the clock signal to the device under test freely by an arbitrary factor (both integral and fractional number). The assignee of the present invention has disclosed an idea and embodiments of modifying each timing of output event of an event based test system by an arbitrary scaling factor in the U.S. patent application Ser. No. 09/286,226.

Figure 7:
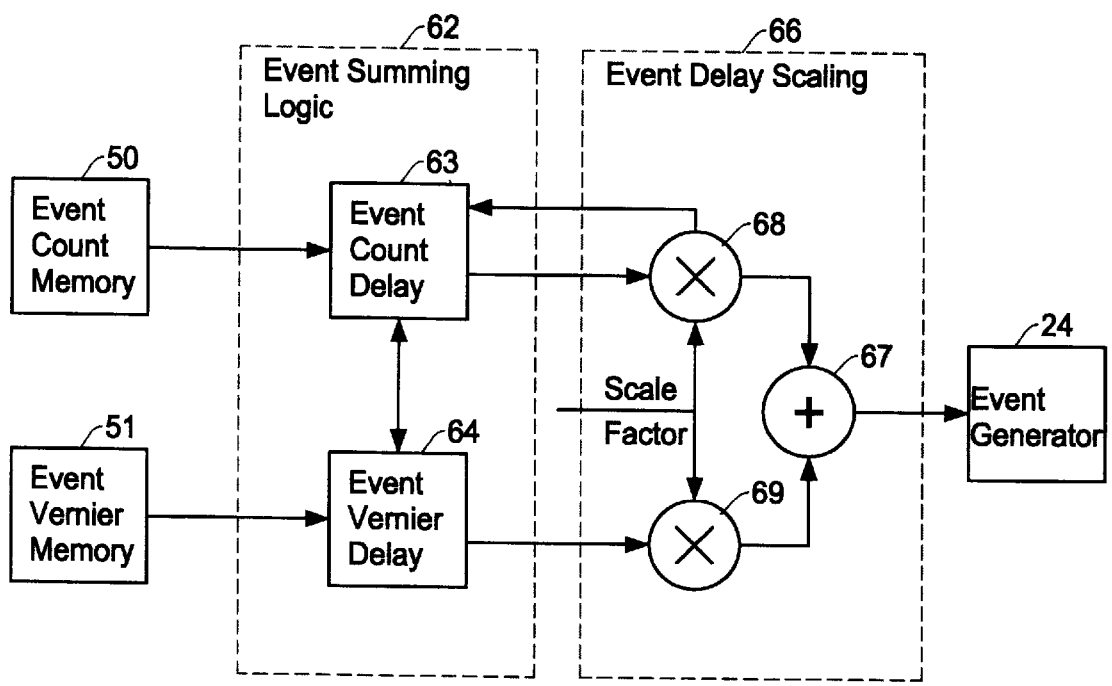
FIG. 7 is a block diagram showing an example of configuration in a scaling circuit for adjusting the repetition rate of the clock signal from the event based test system to the device under test by an arbitrary factor for measuring the power source current by the power source current measurement unit of the present invention.

FIG. 7 shows an essential part of the scaling unit disclosed in the above U.S. patent application. The event summing scaling logic 52 in the event based test system of FIG. 2B is formed of an event summing logic 62 and an event delay scaling 66 of FIG. 7. The timing data from the event count memory 50 and the event vernier memory 51 are provided to the event summing logic 62 whereby adding the timing delay for each event.

The data obtained by summing the timing data in the event summing logic 62 is multiplied by a scaling factor by the event delay scaling 66, thereby modifying the timing of the event. This operation involves a carry over process between the integral part data and the fractional part data, which is described in the above U.S. patent application in detail. Thus, in the case where the event produced by the event generator 24 (FIG. 2) is used as a clock signal for the device under test, the arrangement of FIG. 7 is able to freely modify a repetition rate of the clock signal.

With use of the scaling capability, the time period of the clock signal of FIG. 6A can be sufficiently increased, such as to several ten microseconds which is equivalent to the operation speed of the power source current measurement unit. Thus, when the switch SW2 is driven in synchronism with the clock signal, the clock signal period and the operation of the current measurement unit establish a one-to-one timing relationship. Under this situation, one waveform of the power source current can be obtained for one clock signal period, which is measured by the integration circuit 83 and the AD converter 85. Thus, in the case where a defect in the power source current is detected, it is possible to specify the relationship between such a defect and the clock signal (test pattern) applied to the device under test.

As has been foregoing, the power source current measurement unit of the present invention is capable of measuring the power source current of the device under test at high speed with high accuracy. Thus, the power source current measurement unit is advantageously applied to measurement of the power source current $I_{DD}$ of CMOS device. The power source current measurement unit of the present invention is capable of measuring the power source current of a device under test within a short period of time with high accuracy by integrating the measured current waveforms by an integration circuit and averaging the integrated value by the measured time.

The power source current measurement unit of the present invention can be advantageously employed in an event based test system. The power source current measurement unit is capable of directly measuring the average value of power source current of the device under test by adjusting the repetition rate of the clock signal supplied from the event based test system to the device under test by an arbitrary factor and detecting the power source current in synchronism with the adjusted clock signal. Since the power source current of the device under test can be measured in synchronism with the clock signal, it is possible to detect the relationship between the defective power source current and a specific clock signal which caused the defect.

What is claimed is:

1. A semiconductor test system for testing a semiconductor device by supplying a test signal to a semiconductor device under test and evaluating a resultant response output of the device under test, comprising:

a test signal generating means for generating a test signal to the device under test based on event data prepared in advance;

a pin electronics provided between the test signal generating means and the device under test and having a driver which provides the test signal to the device under test with predetermined amplitude and a comparator which compares a response output of the device under test with a predetermined reference voltage; and a power source current measurement unit provided either inside or outside of the pin electronics for measuring a power source current of the device under test;

wherein the power source current measurement unit is comprised of:

a DA converter for generating a source voltage which is supplied to a device under test based on a digital signal received;

an operational amplifier for forming a negative feedback loop and supplying the source voltage from the DA converter to a power pin of the device under test thereby flowing a power source current to the power pin through a current measurement resistor whose resistance is known;

a voltage amplifier for amplifying a voltage representing the power source current supplied to the device under test;

an integration circuit formed of an operational amplifier provided with an integration capacitor and a switch for open/close the integration capacitor for integrating an output signal of the voltage amplifier for a predetermined integration time in such a way that the output signal is continuously accumulated during the integration time; and an AD converter for converting an output signal of the integration circuit to a digital signal after the integration time.

2. A semiconductor test system as defined in claim 1, wherein a clock signal for the device under test is generated by the semiconductor test system for activating an operation of the device under test and an accumulated value of the power source current resultant to the clock signal is measured by the power source current measurement unit.

3. A semiconductor test system as defined in claim 1 further comprising a scaling unit which modifies timing data in the event data by an arbitrary factor, and wherein a repetition rate of a clock signal from the semiconductor test system to the device under test is changed in response to the timing data modified by the scaling unit.

4. A semiconductor test system as defined in claim 1 further comprising a scaling unit which modifies timing data in the event data by an arbitrary factor, and wherein a repetition rate of a clock signal from the semiconductor test system to the device under test is changed in response to the timing data modified by the scaling unit, which enables to synchronize the clock signal period with open/close operations of the switch in the integration circuit in the power source current measurement unit thereby measuring the power source current corresponding to a particular period of the clock signal.

5. A semiconductor test system as defined in claim 1 further comprising a n event memory for storing the event data which describes a timing of each event, an address sequencer for providing address data to the event memory to read-out the event data; and means for producing a test signal based on the event data from the event memory.

* * * * *